(12) United States Patent
Bechtel et al.

(10) Patent No.: US 11,552,225 B2
(45) Date of Patent: Jan. 10, 2023

(54) PHOSPHOR LAYER FOR MICRO-LED APPLICATIONS

(71) Applicant: Lumileds LLC, San Jose, CA (US)

(72) Inventors: Hans-Helmut Bechtel, Roetgen (DE); Jens Meyer, Cologne (DE); Matthias Heidemann, Alsdorf (DE); Petra Huppertz, Roetgen (DE); Joerg Feldmann, Aachen (DE)

(73) Assignee: Lumileds LLC, San Jose, CA (US)

( * ) Notice: Subject to any disclaimer, the term of this patent is extended or adjusted under 35 U.S.C. 154(b) by 191 days.

(21) Appl. No.: 16/887,618

(22) Filed: May 29, 2020

(65) Prior Publication Data

US 2020/0411736 A1 Dec. 31, 2020

(30) Foreign Application Priority Data

Jun. 25, 2019 (EP) .................................... 19182324

(51) Int. Cl.
*H01L 33/50* (2010.01)
*H01L 27/15* (2006.01)

(52) U.S. Cl.
CPC ............ *H01L 33/505* (2013.01); *H01L 27/15* (2013.01); *H01L 2933/0041* (2013.01)

(58) Field of Classification Search
None
See application file for complete search history.

(56) References Cited

U.S. PATENT DOCUMENTS

| | | | |
|---|---|---|---|
| 7,521,862 B2 | 4/2009 | Mueller et al. | |
| 7,554,258 B2 | 6/2009 | Rossner et al. | |
| 8,203,161 B2 | 6/2012 | Simonian et al. | |
| 8,721,098 B2 | 5/2014 | Bechtel et al. | |
| 8,791,630 B2 | 7/2014 | Maemura et al. | |
| 8,994,259 B2 | 3/2015 | Tamaki et al. | |
| 9,033,531 B2 | 5/2015 | Ravilisetty et al. | |
| 9,634,384 B2 | 4/2017 | Shibahara et al. | |
| 9,722,148 B2 | 8/2017 | Mueller et al. | |
| 9,865,577 B2 | 1/2018 | Bibl et al. | |
| 9,972,751 B2 | 5/2018 | Saka et al. | |
| 10,128,419 B1 | 11/2018 | Shimizu et al. | |
| 10,439,109 B2 | 10/2019 | Borelli et al. | |
| 10,546,841 B2 | 1/2020 | Rogers et al. | |
| 2005/0093008 A1 | 5/2005 | Suehiro et al. | |
| 2007/0125984 A1 | 6/2007 | Tian et al. | |
| 2007/0273282 A1 | 11/2007 | Radkov et al. | |
| 2007/0298250 A1 | 12/2007 | Weimer et al. | |

(Continued)

FOREIGN PATENT DOCUMENTS

CN 105637061 A 6/2016
EP 1367655 A1 12/2003

(Continued)

OTHER PUBLICATIONS

The extended European Search Report, EP20157448.0, dated Jul. 3, 2020, 14 pages.

(Continued)

*Primary Examiner* — Bo B Jang

(57) ABSTRACT

Embodiments include a device having a micro-LED that includes at least two, individually addressable light emitting diodes on a same substrate; a phosphor converter layer disposed on the micro-LED, the phosphor converter layer including phosphor particles having a D50 of greater than 1 μm and less than 10 μm.

20 Claims, 19 Drawing Sheets

(56) References Cited

U.S. PATENT DOCUMENTS

| | | |
|---|---|---|
| 2008/0084150 A1 | 4/2008 | Cok |
| 2008/0121917 A1 | 5/2008 | Weisbuch et al. |
| 2012/0074835 A1 | 3/2012 | Piquette et al. |
| 2012/0223875 A1 | 9/2012 | Lau et al. |
| 2014/0226335 A1 | 8/2014 | Menkara |
| 2015/0255683 A1 | 9/2015 | Stoll et al. |
| 2016/0149097 A1 | 5/2016 | Saka et al. |
| 2017/0235216 A1 | 8/2017 | Maeda et al. |
| 2018/0122993 A1 | 5/2018 | Camras et al. |
| 2018/0123005 A1 | 5/2018 | Ozeki et al. |
| 2018/0190712 A1 | 7/2018 | Xu et al. |
| 2018/0313501 A1 | 11/2018 | Anc et al. |
| 2019/0044038 A1 | 2/2019 | Shimzu et al. |
| 2019/0093871 A1 | 3/2019 | Sato et al. |
| 2019/0165036 A1 | 5/2019 | Xu et al. |
| 2019/0169494 A1 | 6/2019 | Nakamura et al. |
| 2019/0198564 A1 | 6/2019 | Tandon et al. |
| 2020/0142288 A1 | 5/2020 | Okuno et al. |
| 2020/0203567 A1 | 6/2020 | Basin et al. |
| 2020/0388726 A1 | 12/2020 | Meyer et al. |
| 2021/0063652 A1 | 3/2021 | Tångring et al. |
| 2021/0111316 A1 | 4/2021 | Lopez-Julia et al. |
| 2021/0111320 A1 | 4/2021 | Lopez-Julia et al. |
| 2022/0115566 A1 | 4/2022 | Meyer et al. |

FOREIGN PATENT DOCUMENTS

| | | |
|---|---|---|
| EP | 2645433 A2 | 10/2013 |
| EP | 2645433 A3 | 1/2016 |
| JP | H10-036827 A | 2/1998 |
| JP | 2003243727 A | 8/2003 |
| JP | 2004146835 A | 5/2004 |
| JP | 2006005367 A | 1/2006 |
| JP | 2006054313 A | 2/2006 |
| JP | 2007031563 A | 2/2007 |
| JP | 2010245576 A | 10/2010 |
| JP | 2012031377 A | 2/2012 |
| JP | 2012074835 A | 4/2012 |
| JP | 2012162600 A | 8/2012 |
| JP | 2013109907 A | 6/2013 |
| JP | 2013-203822 A | 10/2013 |
| JP | 2013216800 A | 10/2013 |
| JP | 2014507755 A | 3/2014 |
| JP | 2016100485 A | 5/2016 |
| JP | 2016-523450 A | 8/2016 |
| JP | 2018022683 A | 2/2018 |
| JP | 2019028380 A | 2/2019 |
| JP | 2019537058 A | 12/2019 |
| KR | 20080076990 A | 8/2008 |
| KR | 20090017696 A | 2/2009 |
| KR | 2009-0082499 A | 7/2009 |
| KR | 20120065273 A | 6/2012 |
| KR | 20120086731 A | 8/2012 |
| WO | 2008/007232 A2 | 1/2008 |
| WO | 2010053341 A1 | 5/2010 |
| WO | 2016/041838 A1 | 3/2016 |
| WO | 2019/141480 A1 | 7/2019 |

OTHER PUBLICATIONS

From the EPO as the ISA, "Notification of Transmittal of the International Search Report and the Written Opinion of the International Searching Authority, or the Declaration", PCT/US2020/054938, dated Jan. 26, 2021, 20 pages.

From the EPO as the ISA, Notification of Transmittal of The International Search Report and the Written Opinion of the International Searching Authority, corresponding to PCT/EP2020/062258, dated Aug. 31, 2020, 12 pages.

The extended European Search Report, EP19178430.5, dated Dec. 6, 2019, 6 pages.

European Search Report corresponding to EP19182324, dated Dec. 16, 2019, 4 pages.

From the International Searching Authority, Notification of Transmittal of the International Search Report and the Written Opinion of the EPO as the ISA corresponding to PCT/EP2020/064856, dated Sep. 2, 2020, 13 pages.

Abstract of EP2356702A1, Aug. 17, 2011, Applicant: UAB HORTILED, corresponding to WO2010053341A1, 1 page.

The extended European Search Report corresponding to EP 19182324, dated Apr. 15, 2020, 11 pages.

PHOSPHOR LAYER FOR MICRO-LED APPLICATIONS

CROSS REFERENCE TO RELATED APPLICATIONS

This application claims benefit of priority to European Patent Application 19182324.4 filed Jun. 25, 2019, which is incorporated herein by reference in its entirety.

BACKGROUND

US2012/223875 describes fabrication of a high-resolution, Active Matrix (AM) programmed monolithic Light Emitting Diode (LED) micro-array using flip-chip technology. The fabrication process includes fabrications of an LED micro-array and an AM panel, and combining the resulting LED micro-array and AM panel using the flip-chip technology. The LED micro-array is grown and fabricated on a sapphire substrate and the AM panel can be fabricated using PMOS process, NMOS process, or CMOS process. LED pixels in a same row share a common N-bus line that is connected to the ground of AM panel while p-electrodes of the LED pixels are electrically separated such that each p-electrode is independently connected to an output of drive circuits mounted on the AM panel. The LED micro-array is flip-chip bonded to the AM panel so that the AM panel controls the LED pixels individually and the LED pixels exhibit excellent emission uniformity. US2012/223875 indicates that according to this constitution, incompatibility between the LED process and the PMOS/NMOS/CMOS process can be eliminated.

US2018/190712 describes a full-color display device based on III-Nitride semiconductors. The display device includes an array of micro-LEDs, monolithically integrated on a single chip of the epitaxially grown LED heterostructure, and flip-chip bonded to a silicon backplane of active matrix driving circuits, and color conversion layers. The LED substrate of the micro-LED array is removed, and the n-regions of the p-n or p-i-n heterojunctions of the micro-LEDs are connected via a thin n-type III-nitride epitaxial layer less than 20 μm thick. The surface of the thin n-type III-nitride epitaxial layer is covered with a layer of transparent/semi-transparent conductive material, forming the common n-type electrode of the micro-LED devices, rendering the vertical current flow in the micro-LED emitters. Each addressing and driving pixel of the active matrix driving circuits contains at least a switching transistor, a switching-driving transistor, and a latch register.

US2007/273282 describes an optoelectronic device comprising a light source, an encapsulant with Refractive Index n1, and a phosphor with Refractive Index n2 which is within the range of from about 0.85n1, to about 1.15n1. US2007/273282 also describes a method of adjusting the Refractive Index nx of a phosphor which is higher than a predetermined value n2. The method comprises partially or completely replacing one or more first element(s) in the phosphor with one or more second elements which typically have lower atomic weight than the first element(s). The phosphor is chemically stable and optically comparable with the encapsulant; and the optoelectronic device has gained technical merits such as increased light output efficiency, easy manufacturability, and cost-effectiveness, among others.

WO2016/041838 describes a method for providing luminescent particles with a hybrid coating, the method comprising (i) providing a first coating layer onto the luminescent particles by application of a sol-gel coating process, thereby providing coated luminescent particles; and (ii) providing a second coating layer onto the coated luminescent particles by application of an atomic layer deposition process. WO2016/041838 also describes luminescent particles comprise a luminescent core, a first coating layer having a first coating layer thickness (d1) in the range of 50-300 nm, and a second coating layer having a second coating layer thickness (d2) in the range of 5-250 nm.

SUMMARY

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer. Phosphors may be formed into a ceramic tile that is disposed in the path of light emitted by the LED.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

In an aspect, the invention provides a device comprising: a micro-LED comprising at least two individually addressable light emitting diodes on a same substrate; and a phosphor converter layer disposed on the micro-LED, the phosphor converter layer comprising a plurality of phosphor particles having a D50 of greater than 1 μm and less than 10 μm.

In embodiments, the plurality of phosphor particles has a D50 of greater than 2 μm and less than 7 μm.

In embodiments, the plurality of phosphor particles has a D50 of greater than 3 μm and less than 5 μm.

In embodiments, wherein a thickness of the phosphor converter layer is greater than 4 μm and less than 20 μm.

In embodiments, wherein a thickness of the phosphor converter layer is greater than 8 μm and less than 15 μm.

In embodiments, a thickness of the phosphor converter layer is greater than 10 μm and less than 13 μm.

In embodiments, the phosphor converter layer further comprises a matrix, and the matrix has a refractive index of 1 or greater and less than or equal to 1.5.

In embodiments, the matrix has a refractive index of 1 or greater and less than 1.4.

In embodiments, the matrix has a refractive index of 1 or greater and less than 1.2.

In embodiments, the phosphor converter layer further comprises a thin layer of non-luminescent material coating (on) the phosphor particles.

In embodiments, the thin layer comprises a metal oxide.

In embodiments, the thin layer comprises at least one of $Al_2O_3$, $HfO_2$, $Ta_2O_5$, $ZrO_2$, $TiO_2$, and $SiO_3$.

In embodiments, the thin layer is formed by atomic layer deposition.

In embodiments, the thin layer has a thickness of less than 200 nm.

In an aspect, the invention provides a device comprising: a light emitting diode; and a phosphor converter layer on the light emitting diode, the phosphor converter layer including a plurality of phosphor particles and a thin layer of a non-luminescent material formed over the phosphor particles.

In embodiments, a thickness of the phosphor converter layer is greater than 4 μm and less than 20 μm, wherein the phosphor converter layer further comprises a thin layer of non-luminescent material coating on the phosphor particles, and wherein the thin layer has a thickness of less than 200 nm.

Hence, amongst others the invention provides in an aspect a device comprising: a micro-LED comprising at least two individually addressable light emitting diodes on a same substrate; and a phosphor converter layer disposed on the micro-LED, the phosphor converter layer comprising a plurality of phosphor particles having a D50 of greater than 1 μm and less than 10 μm, wherein a thickness of the phosphor converter layer is greater than 4 μm and less than 20 μm, wherein the phosphor converter layer further comprises a thin layer of non-luminescent material coating on the phosphor particles, and wherein the thin layer has a thickness of less than 200 nm.

Hence, amongst others the invention provides in an aspect a device comprising: a light emitting diode; and a phosphor converter layer on the light emitting diode, the phosphor converter layer including a plurality of phosphor particles and a thin layer of a non-luminescent material formed over the phosphor particles, wherein a thickness of the phosphor converter layer is greater than 4 μm and less than 20 μm, wherein the phosphor converter layer further comprises a thin layer of non-luminescent material coating on the phosphor particles, and wherein the thin layer has a thickness of less than 200 nm.

In embodiments, the particle size D50 is less than 9 μm and the thickness of the thin layer is less than 15 μm.

In embodiments, the phosphor converter layer further comprises a thin layer of non-luminescent material coating on the phosphor particles which is obtainable by spray coating or sedimentation.

In embodiments, the thin layer has a thickness between 40-150 nm.

In embodiments, the ALD coating may be directly on the phosphor particles of the phosphor layer, without another (non-luminescent) coating in between (the phosphor particle(s) and the ALD coating).

BRIEF DESCRIPTION OF THE DRAWINGS

FIG. 1b illustrates a side view of a portion of one type of micro-LED device through line AA of FIG. 1a.

DETAILED DESCRIPTION

Micro-LEDs, also referred to as μLEDs, are arrays of a large number of individually addressable LED devices on one chip. Micro-LED arrays have application in lighting, for instance automotive lighting, and displays. As the individual LEDs, or pixels, are individually addressable, light patterns can be displayed on the micro-LED.

Figure 1A:
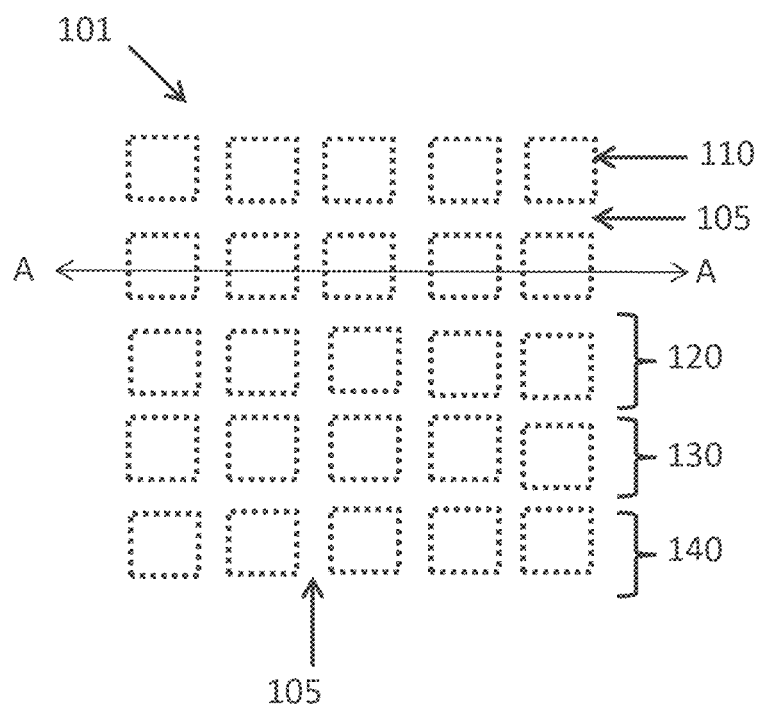
FIG. 1a illustrates a plan view of a portion of one type of micro-LED device.

FIG. 1a illustrates a plan view of a portion of one type of micro-LED device. In FIG. 1a, each square 110 represents a single LED device, or pixel, of which there may be in the range of 20000 per micro-LED. FIG. 1a shows only a portion of such a micro-LED for illustration purposes. Between each individual LED there is a gap 105, which may be, for example, a metal wall (e.g., Cu), that coats each side of an LED die 110. Dimensions for an individual pixel may be, for example, 40×40 μm² and dimensions for gap 105 may be, for example 8 μm.

Figure 1B:
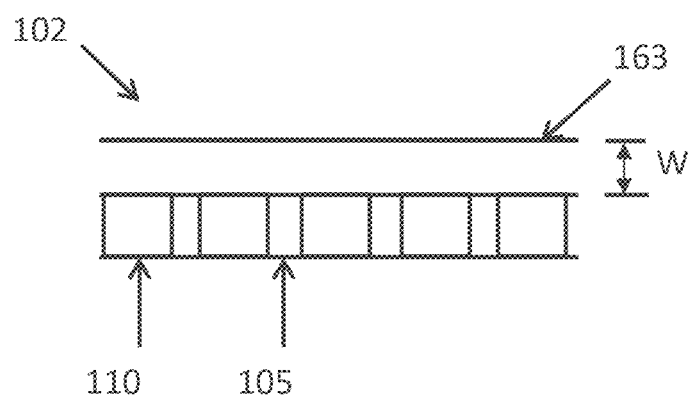

One method for forming a micro-LED is to use epitaxial growth to form the multiple individual LEDs 110 on a die in a flip-chip construction as is known in the art. FIG. 1b illustrates a side view of a portion of one type of micro-LED device taken through line AA of FIG. 1a. FIG. 1b shows LED dies 110.

A phosphor converter 163 is on LED dies 110. The phosphor converter 163 may be formed of phosphor particles contained in a matrix, for example, garnet particles contained in silicone. Alternatively, or in addition, the phosphor converter 163 contains a densely sintered phosphor ceramic, such as Lumiramic™. In one example, the individual LEDs produce a blue light and the phosphor converter converts the blue light to a white light to produce a micro-LED that is monochrome white at a CCT of about 5700K.

Figure 2:
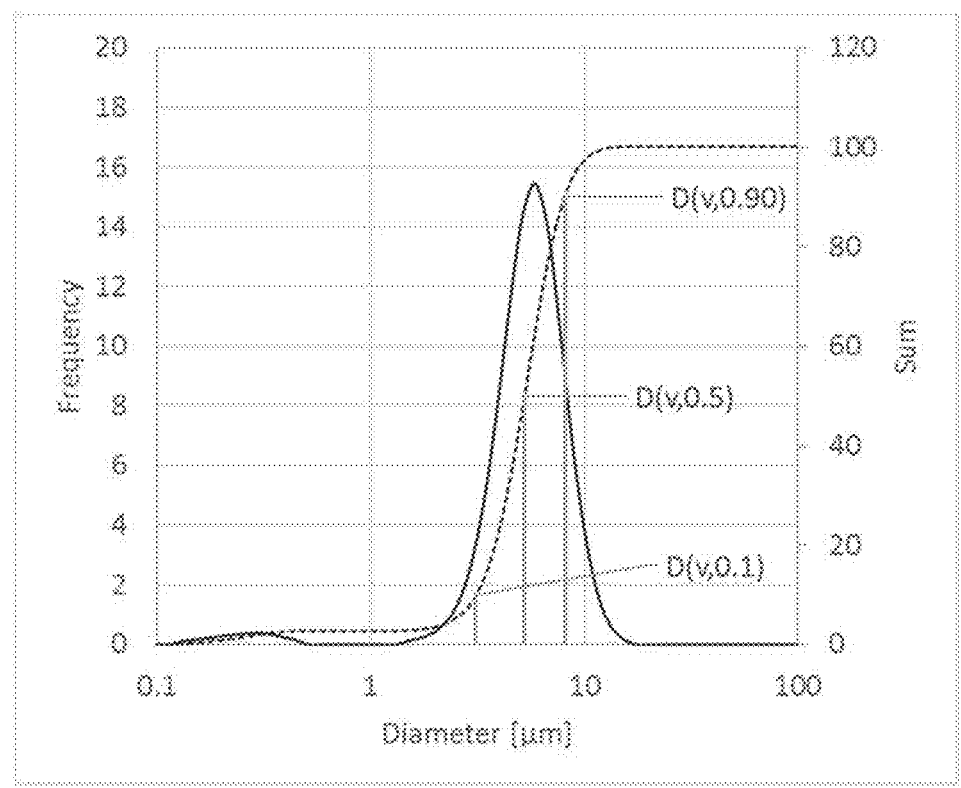
FIG. 2 shows a measured particle size distribution of a garnet phosphor powder.

The phosphor converter 163 can be defined by three parameters: (a) its thickness, (b) the refractive index of the matrix, and (c) the particle size and the refractive index of the phosphor material. The thickness, or width, of phosphor converter 163 is represented by W in FIG. 1b. The refractive index of the matrix is determined by the material chosen for the matrix, which is often silicone, with a refractive index of 1.5. The phosphor materials in the phosphor converter 163 have a particle size given by D50. Here, D represents the diameter of powder particles, and D50 means a cumulative 50% point of volume (or 50% pass particle size) and may be referred to as an average particle size or median diameter. D50 values for particles may be provided by the supplier of the powder particle material or may be measured. For example, FIG. 2 shows a measured particle size distribution of a garnet phosphor powder analyzed using a PA-950 laser particle size analyzer from Horiba Company, with a measuring range of 0.01 µm to 3000 µm. The measurement principle is based on the measurement of the pattern of scattered light in a wide angular range. This distribution of scattered light is used to calculate the particle size distribution using Mie's theory, as is understood by a person of ordinary skill in the art. In the data shown in FIG. 4, D(v, 0.1)=3.10017 (µm), D(v,0.5), which is D50, =5.26114 (µm), and D(v,0.9)=8.17130 (µm), where D(v, x.x) defines the particle sizes for the cumulative particle volumes of 10%, 50% and 90% of the distribution.

Figure 3A:
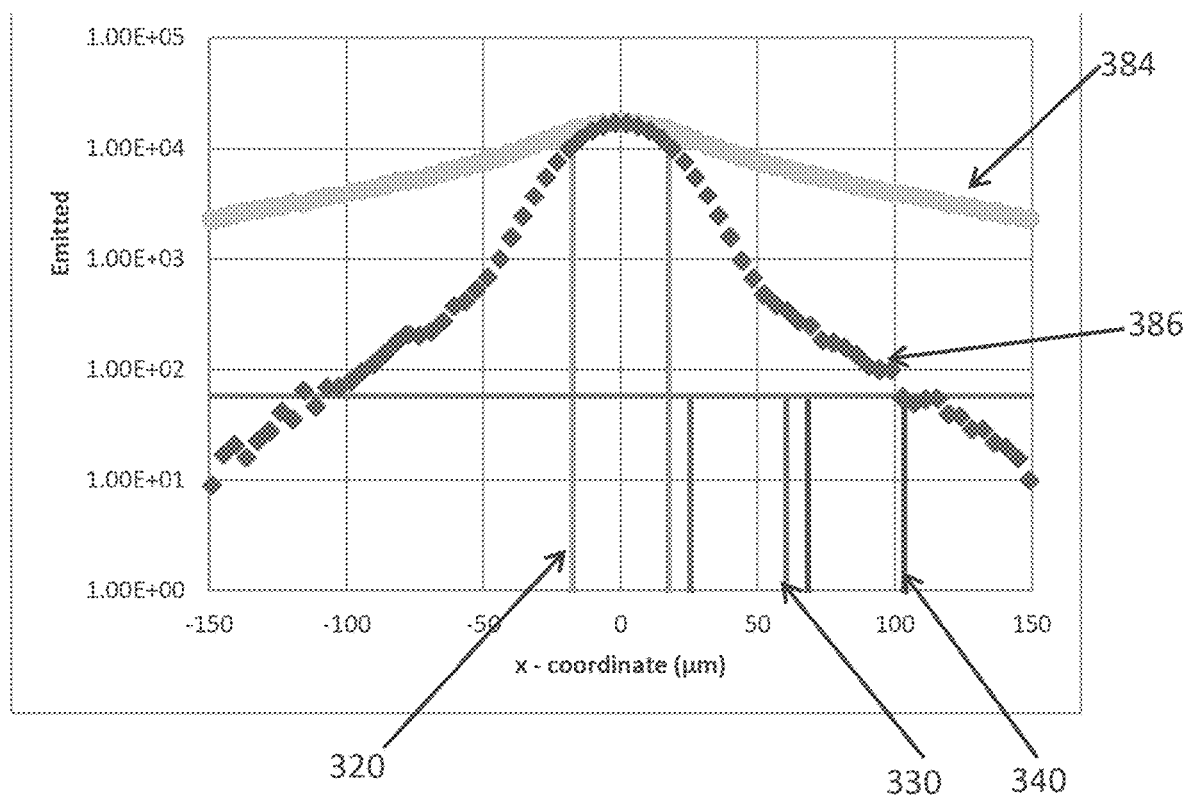
FIG. 3a shows optical resolution of a simulated micro-LED with a single line of pixels in the on state and neighboring pixels in the off state.
Figure 3B:
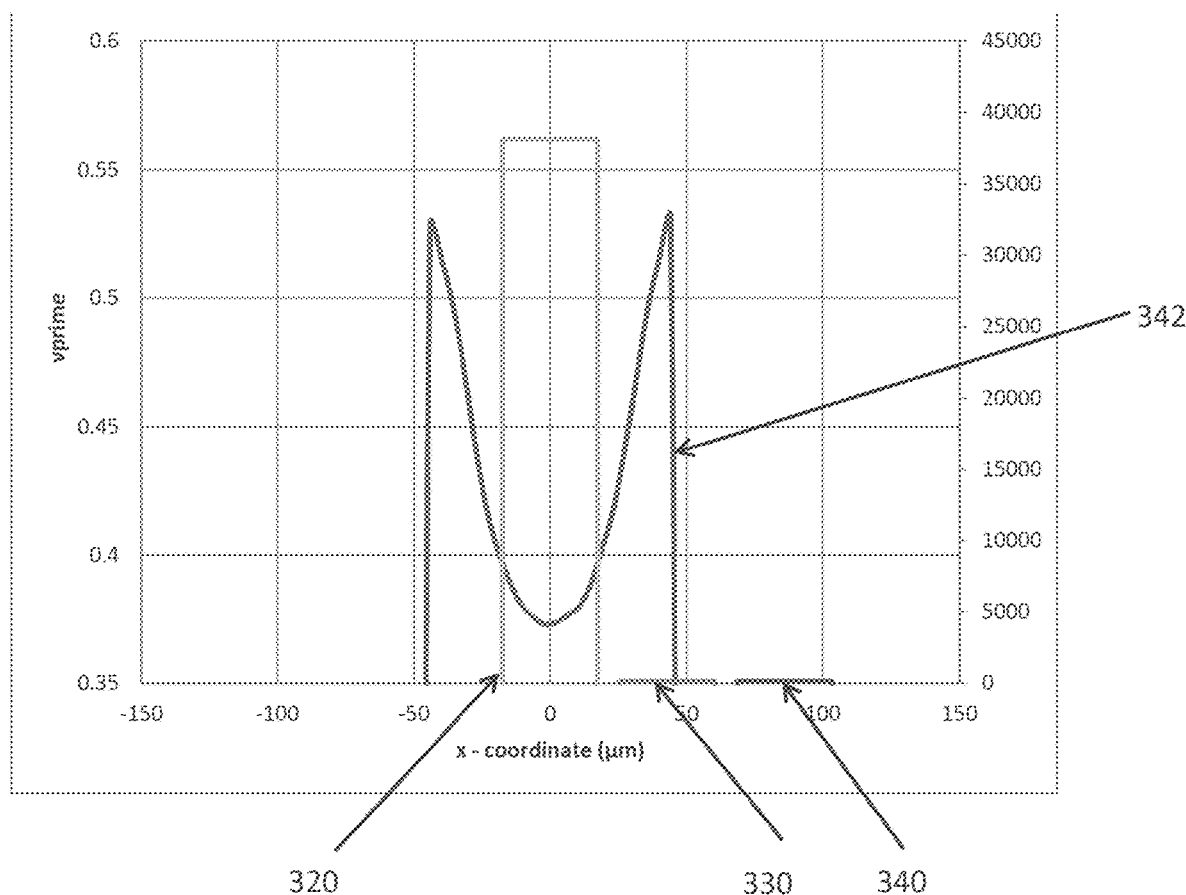
FIG. 3b shows color over source variation of a simulated micro-LED with a single line of pixels in the on state and neighboring pixels in the off state.
Figure 3C:
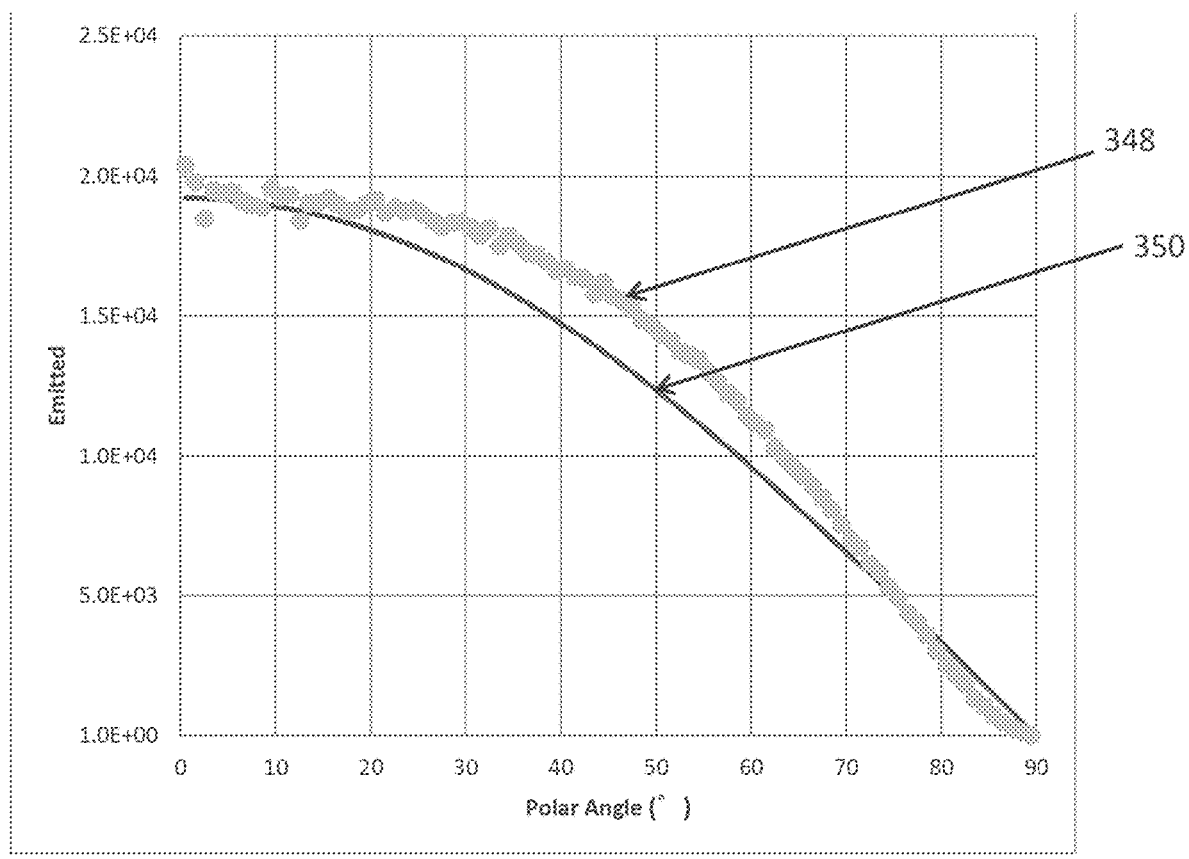
FIG. 3c shows a radiation pattern of a simulated micro-LED with a single line of pixels in the on state and neighboring pixels in the off state.

A problem encountered with micro-LEDs is that there can be very low optical contrast between neighboring pixels when one pixel is on and a neighboring pixel is off. Thus, for instance, if the pixels in row 120 of FIG. 1a are in the on state, and pixels in rows 130 and 140 are in the off state, light emitted from the pixels in row 120 extends across the adjacent trench and over the pixels and trench areas on each side of the row 120, so that rows 130 and 140 (and the equivalent rows on the opposite side of row 120) do not appear dark, or off. This problem is illustrated in FIGS. 3a, 3b, and 3c, which show a simulation for a single line of pixels (row 120 in FIG. 1a) in the on state and neighboring pixels (rows 130 and 140 of FIG. 1a) in the off state. In FIGS. 3a-3c, the x-coordinate is perpendicular to the lines of pixels. The simulation was performed by using a Monte-Carlo ray-tracing algorithm. Blue LED photons are partially absorbed in a scattering phosphor layer. Probabilities for scattering and absorption are derived from single particle Mie coefficients.

FIG. 3a shows the optical resolution of the micro-LED. In FIG. 3a, pixels in rows 120, 130 and 140 are represented by 320, 330 and 340 along the x-coordinate, respectively. For the simulation, each pixel was given a width of 35 µm, and each pixels were separated by 5 µm. The phosphor converter layer, i.e. 163 in FIG. 1b, was given a width (represented by W in FIG. 1b) of 30 µm. Phosphor converter layer 163 was assumed to have phosphor pixels with a size D50 of 13 µm in a matrix with a refractive index of 1.5. Pixel row 320 is in the on state and pixels rows 330 and 340 in the off state. Plot 384 represents the emitted green/yellow light and plot 386 represents the emitted blue light. Plots 384 and 386 show that the light emitted by pixel row 320 extends over the adjacent pixels and the optical resolution is poor. In particular, the optical contrast ratio, which is the integrated flux over the second off-line (340) to the on-line (320), is 1:3.

FIG. 3b shows the color over source variation as the v' color coordinate value along the x-coordinate, and FIG. 3c shows the radiation pattern indicating the amount (flux) of emitted radiation as a function of the polar angle towards the direction of normal emission, for the simulated micro-LED with the single line of pixels in the on state and neighboring pixels in the off state. FIG. 3b shows the calculated emission from the phosphor (384) compared to a cosine distribution (350).

To increase the contrast between on state pixels and off state pixels, and hence improve the optical resolution, parameters that define the phosphor converter 163 were modified.

Figure 4A:
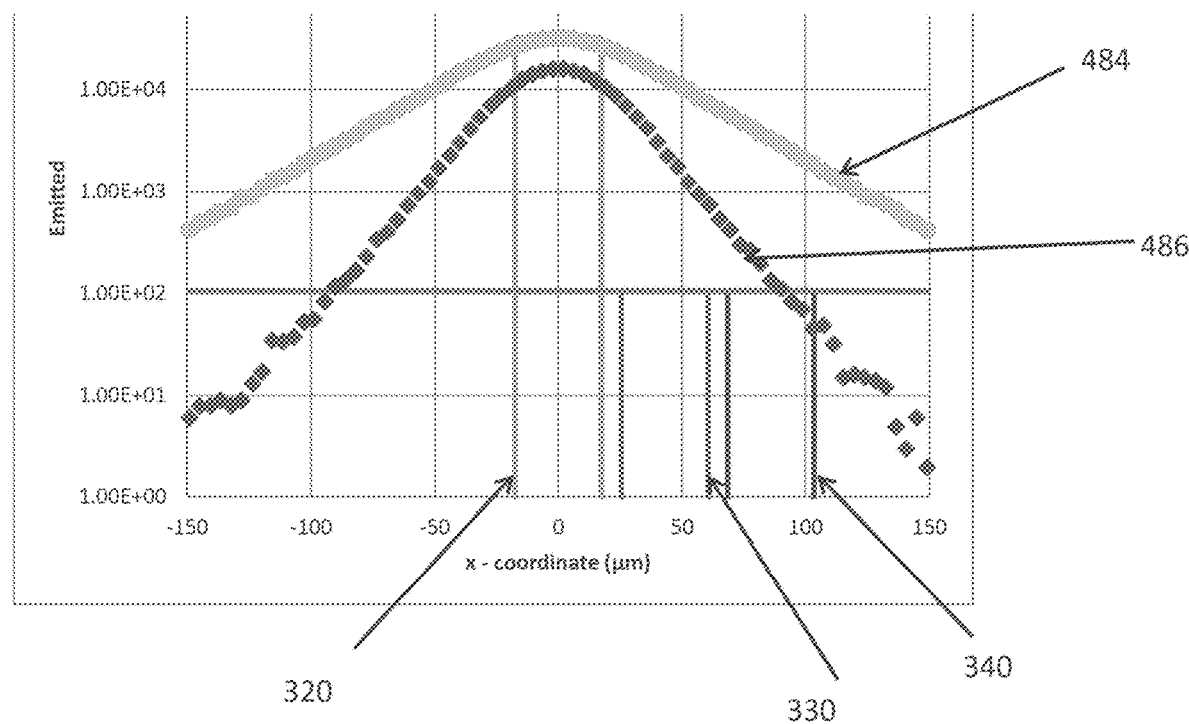
FIG. 4a, FIG. 4b and FIG. 4c show the results for the simulation when everything was held the same as in FIGS. 3a, 3b, and 3c, except that the refractive index of the matrix material was set to equal 1.
Figure 4B:
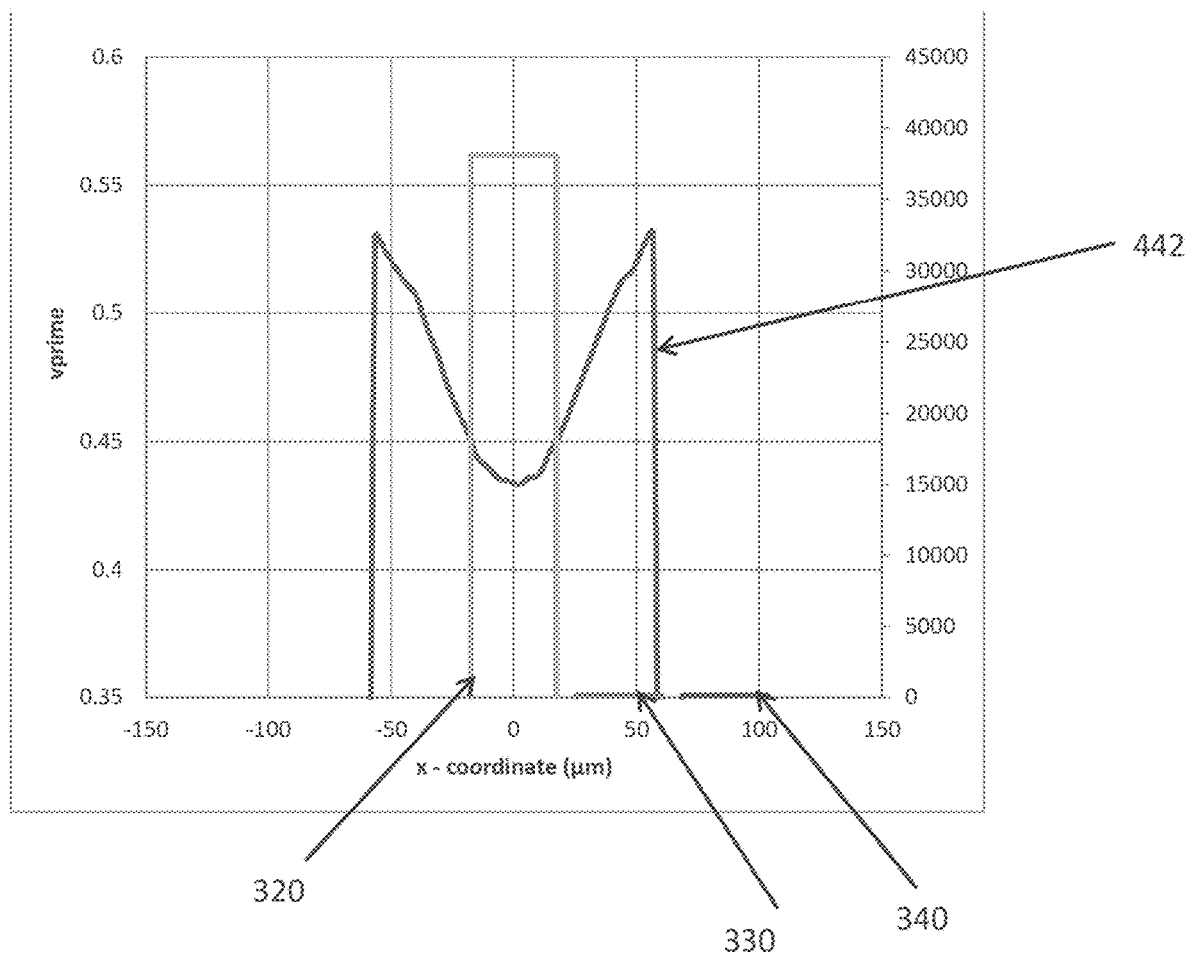
Figure 4C:
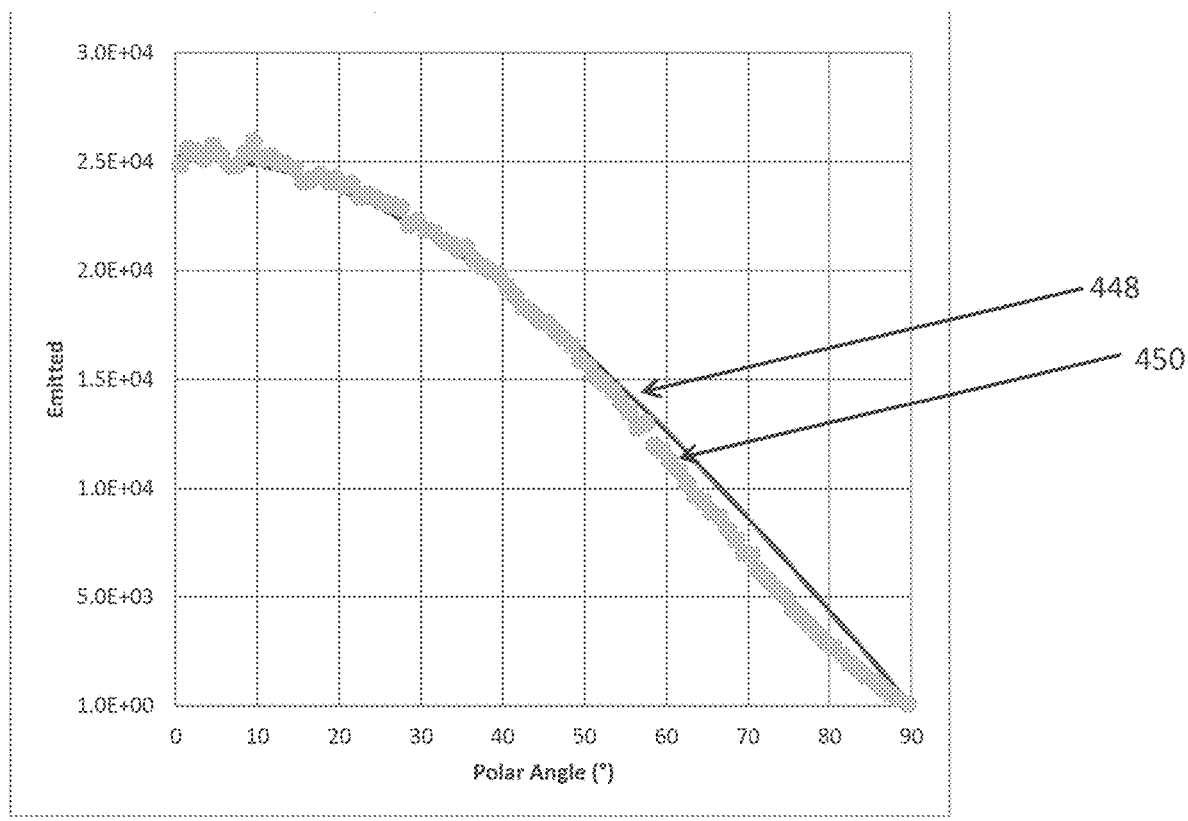

Lowering the refractive index of the matrix for the phosphor converter 163 increases scattering and thus the optical contrast. FIGS. 4a, 4b, and 4c shows the results for the simulation when everything was held the same as in FIGS. 3a, 3b, and 3c, except that the refractive index of the matrix material was set to equal 1, i.e., the refractive index of air. As can be seen in FIGS. 4a, 4b, and 4c, the optical resolution, color over source variation, and radiation pattern all improve with the removal of the matrix, i.e., setting the refractive index value to =1. Viewing for example, FIG. 4a, the emitted green/yellow light plot 484 and the emitted blue light plot 486 both narrow closer to line 320 as compared to the corresponding plots 384 and 385 in FIG. 3a. Viewing, for example, FIG. 4b, the color over source variation 442 is improved as compared to the corresponding 342 in FIG. 3b, and likewise, in FIG. 4c, the radiation pattern 450 is improved (line 448 is the cosine function). The optical contrast ratio increases to 1:18 from 1:3 for when the refractive index=1 vs. 1.5. Thus, to improve the optical contrast, the refractive index of the matrix may be less than 1.5, in particular the refractive index of the matrix may be less than 1.4, and in particular the refractive index of the matrix may be less than 1.2.

Figure 5A:
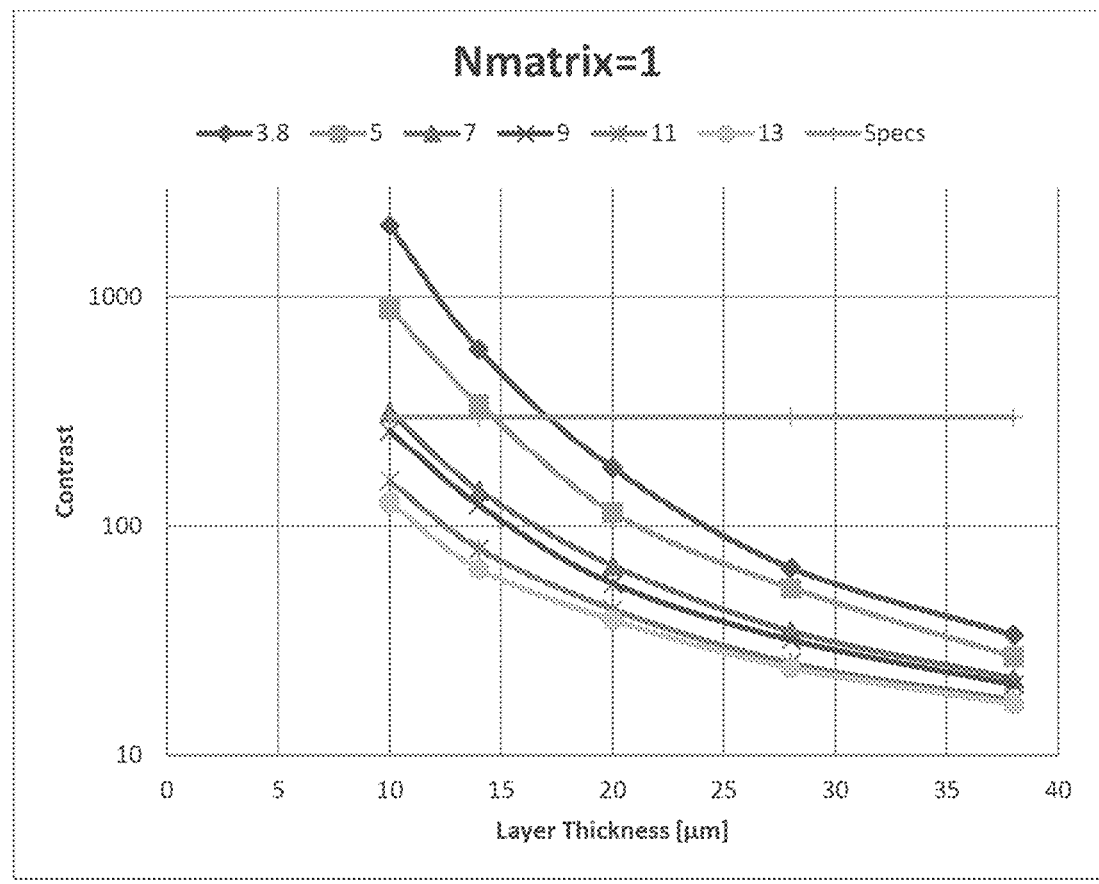
FIG. 5a and FIG. 5b show a simulation data for the same micro-LED as in FIGS. 3a-3c, and 4a-4c, except the simulation was performed for six different particle size values and six different phosphor converter layer thicknesses.
Figure 5B:
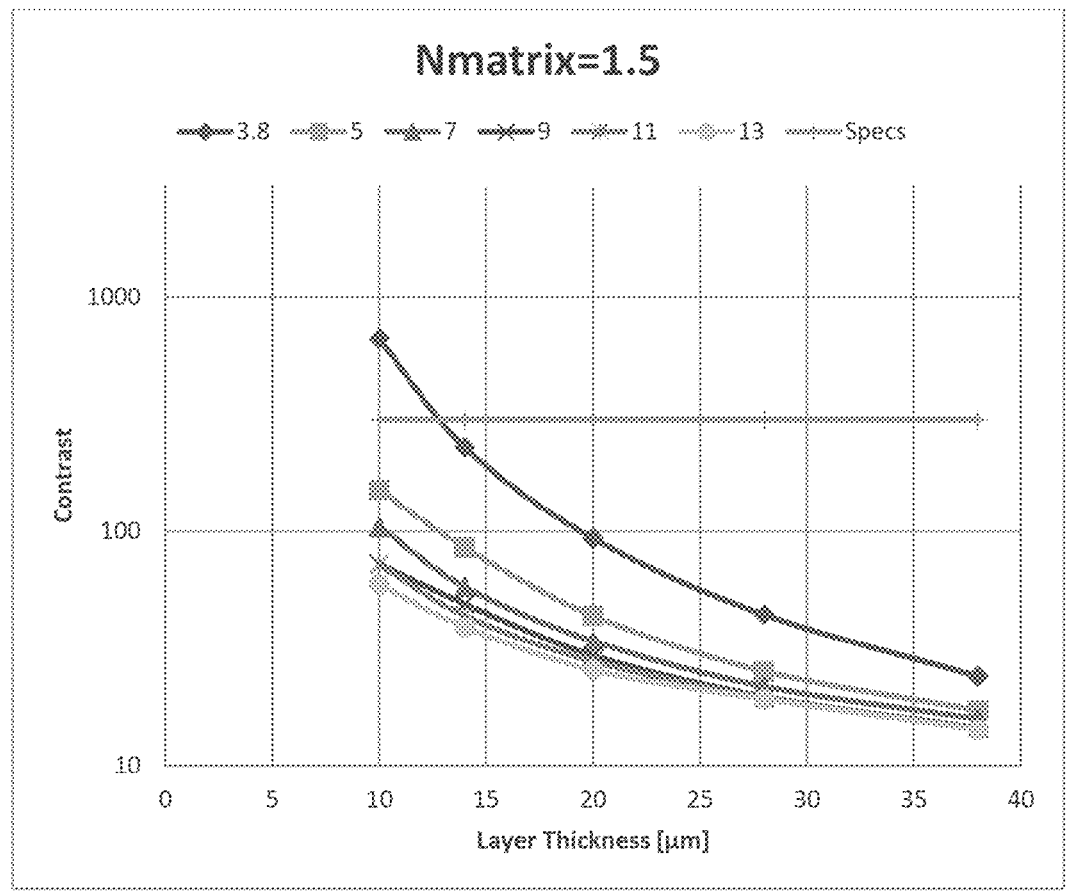

Reducing the particle size of the phosphor material in the phosphor converter 163 and reducing the thickness W of the phosphor converter 163 also increases the optical contrast. FIGS. 5a and 5b show simulation data for the same micro-LED as in FIGS. 3a-3c, and 4a-4c, except the simulation was performed for six different phosphor material particle D50 size values, and five different phosphor converter layer thicknesses W. The simulations were performed with the refractive index set to 1 (FIG. 5a) and set to 1.5 (FIG. 5b). In FIGS. 5a and 5b, the six different particle size D50 values are 3.8 µm, 5 µm, 7 µm, 9 µm, 11 µm, and 13 µm (as indicated by the blue, red, green, purple, light blue and orange lines, respectively). The dashed line indicates an optical contrast ratio of 1:300. The five different phosphor converter layer thicknesses W are 10 µm, 14 µm, 20 µm, 27 µm, and 37 µm. The diagrams in FIGS. 5a and 5b both show that the smaller the particle size in the phosphor converter, and the thinner the phosphor converter layer, the better the optical contrast, especially when the refractive index is =1. Thus, to improve optical contrast the particle size D50 may be between 1 µm and 10 µm, in particular the particle size D50 may be between 2 µm and 7 µm, and in particular the particle size may be between 3 µm and 5 µm. Further, to improve optical contrast the thickness W may be between 4 µm and 20 µm, in particular between 8 µm and 15 µm, and in particular between 10 µm and 13 µm.

Thus a phosphor converter with a high optical contrast (above 300) can only be realized with phosphor particles size D50 of less than 5 μm and a thickness W well below 15 μm when the refractive index is=1. An optical contrast ratio of better than 1:100 can be achieved with refractive index of=1 when the particle size is less than 9 μm and the thickness is less than 15 μm. In practice, D50 of phosphor material particles is limited to 1-3 μm, with the quantum efficiency decreasing with decreasing particles size of the phosphor. Also, the overall layer thickness is limited by the maximum tolerable activator concentration of the phosphor materials (increases may also result in quantum efficiency decreases). With a phosphor converter layer matrix material (like silicone) the parameter space for a high contrast layer is extremely limited. On the other hand, the matrix material within the phosphor converter has two functions. First, to provide mechanical stability to the phosphor converter layer, and secondly, to enhance the blue light extraction from the underlying LED die.

Figure 6A:
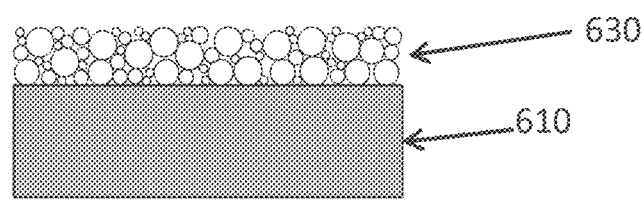
FIG. 6a and FIG. 6b illustrate a method of forming a high optical contrast phosphor converter.
Figure 6B:
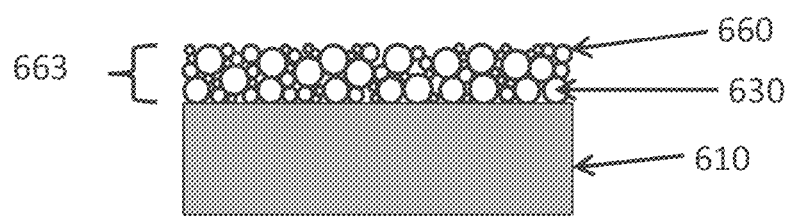

FIG. 6a-6b illustrates a method of forming such a high optical contrast phosphor converter. In FIG. 6a, phosphor material particles 630 are deposited on a substrate 610, which substrate 610 may be, for example, a micro-LED EPI surface. The phosphor material particles 630 may be applied using any suitable method, such as, for example, spray-coating, sedimentation, or the like, which deposits the phosphor material particles 630 in a thin layer, which may be less than 15 μm thick. The phosphor material particles may have a size of D50 less than 5 μm.

Next, as shown in FIG. 6b, the phosphor particles 630 are coated with a thin layer 660 of a non-luminescent material, such as a metal oxide, for example, $Al_2O_3$. Thin layer 660 is indicated in FIG. 6b schematically by a thickening of the lines defining the phosphor particles, compared to FIG. 6a. The thin layer 660 of non-luminescent material may be applied using atomic layer deposition, as will be described in more detail below. Atomic layer deposition allows the non-luminescent material to flow into areas between each of the phosphor particles 630 on substrate 610, so that the non-luminescent material forms a coating on and around each particle to form the thin layer 660 of non-luminescent material. Materials for use in the thin layer 660 include, for example, $Al_2O_3$, $HfO_2$, $Ta_2O_5$, $ZrO_2$, $TiO_2$, and $SiO_2$. The thin layer 660 of non-luminescent material may have a thickness of less than 200 nm, the thickness may be between 20 nm and 300 nm, in particular, the thickness may between 150 nm and 40 nm.

Figure 7A:
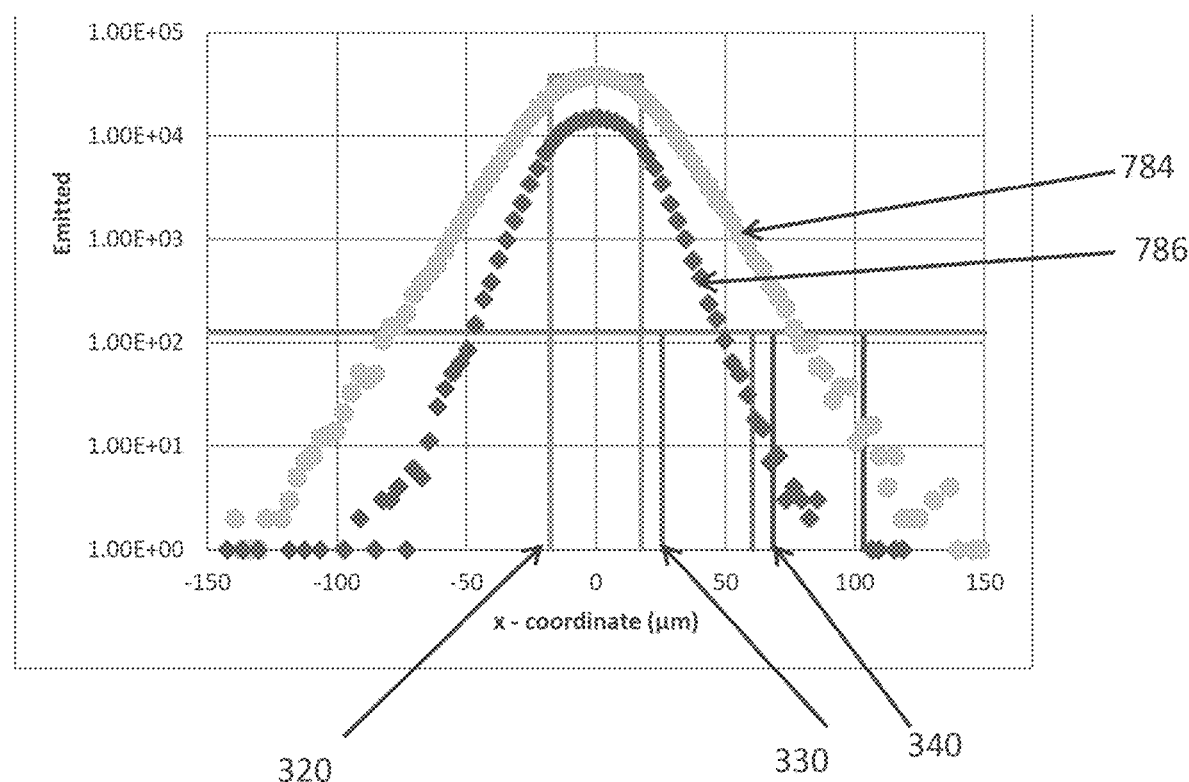
FIG. 7a, FIG. 7b and FIG. 7c show the results for the simulation when everything was held the same as in FIGS. 4a, 4b, and 4c, except that the thickness of the phosphor converter layer and the particle size are reduced.
Figure 7B:
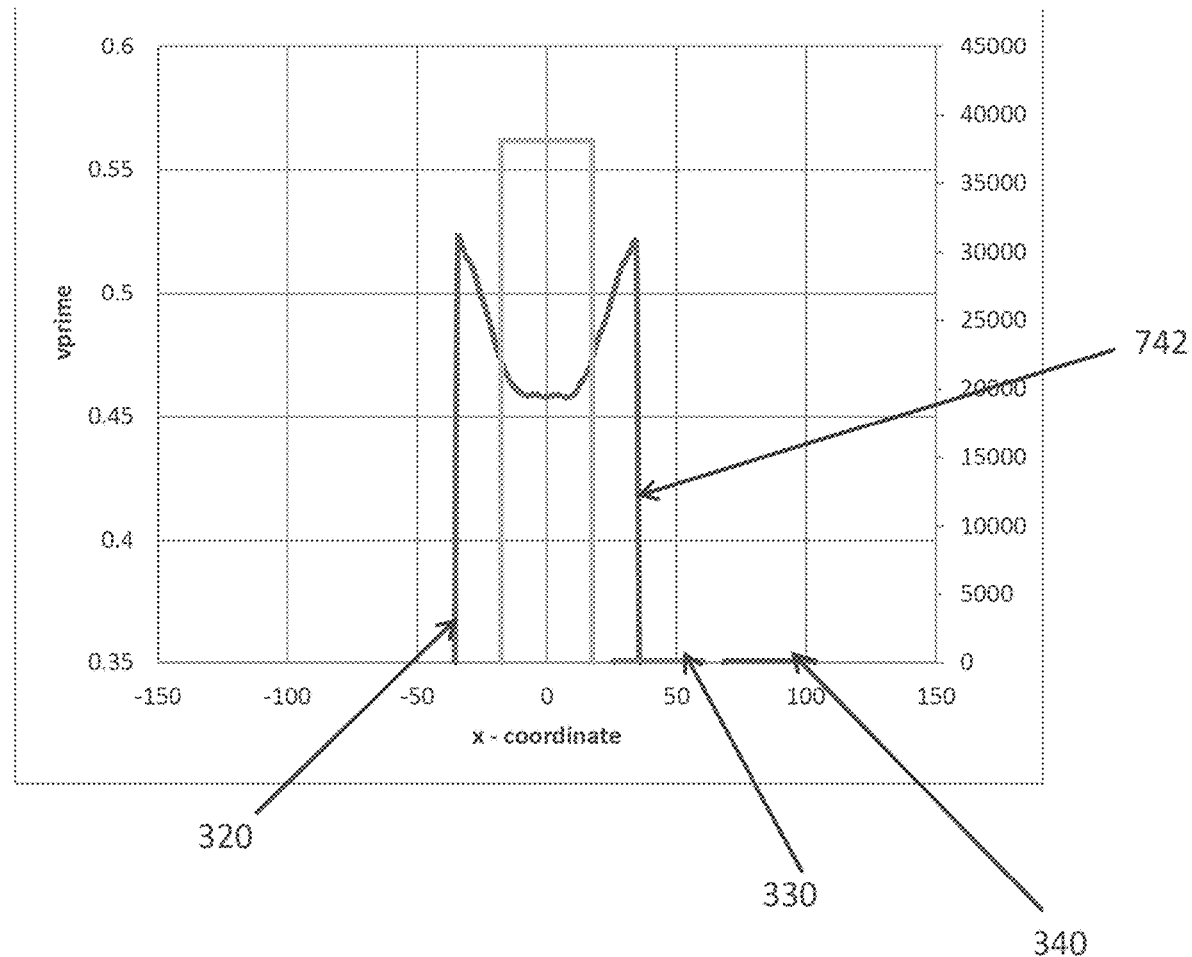
Figure 7C:
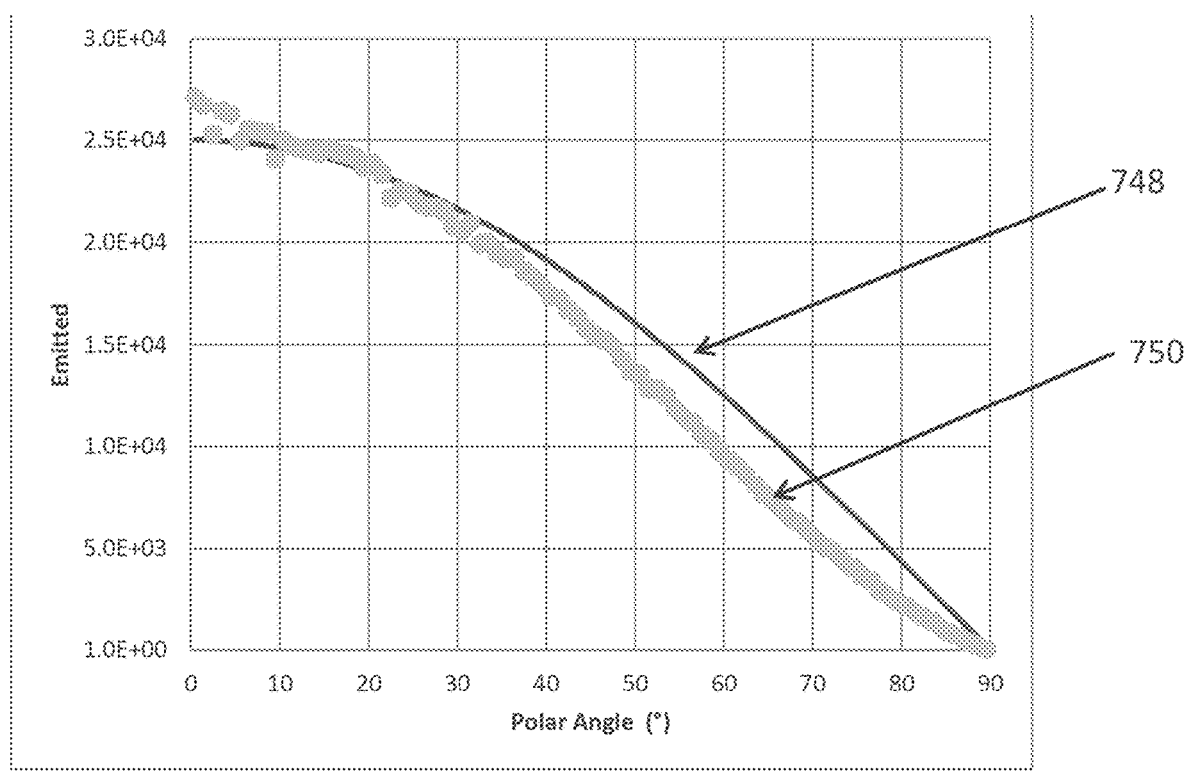

The resulting phosphor converter 663 includes a thin layer of phosphor particles 630 covered with a thin layer 660 of non-luminescent material, such as $Al_2O_3$. The thickness W of the phosphor converter 663 is less than 15 μm. FIGS. 7a, 7b, and 7c show the simulated optical resolution, color over source variation, and radiation pattern for such a phosphor converter 663. In FIGS. 7a, 7b, and 7c, the phosphor converter layer thickness is 14 μm, and the phosphor material particle size is d50=3.8 μm, the refractive index value is 1. All other parameters are the same as in FIGS. 3a-3c, and 4a-4c. As can be seen, by comparing plots 784 and 786 of FIG. 7a to plots 384 and 386 of FIG. 3a, the optical resolution is improved, and the contrast realized is 1:375. The color over source variation 742 (FIG. 7b) and radiation pattern 748 (FIG. 7c) also compare favorably to those in FIGS. 3b and 3c, respectively.

In addition to having a high optical contrast, the phosphor converter 663 is mechanically stable, and enhances extraction of light from the LED die, by coupling phosphor particles which touch the LED surface optically, without significantly decreasing light scattering in the layer. The phosphor converter 663 also has high reliability necessary for a variety of application, including, for example, automotive forward lighting standards. Furthermore, such a phosphor converter layer may be used on any LED, not just micro-LED, where it may provide advantages of reliability and enhancing light extraction.

ALD Details:

Atomic Layer Deposition (ALD) is used to deposit the thin layer 660 on the optical converter 663. ALD is a chemical vapor deposition process which allows the deposition of thin layers of material by applying one atomic layer of a material per cycle in a controllable way. In such process a polymeric network is formed by reaction of a metal oxide precursor with an oxygen source such as water and/or ozone in the gas phase. The ALD reaction is split in (at least) two parts. In a first step the metal (oxide) precursor is fed into the reactor and adsorbs and/or reacts with reactive groups on the surfaces and substantially all non-reacted or adsorbed precursor molecules are removed by reactor purging. In a second step the oxygen source is fed into the reactor and reacts with the metal source on the particle surfaces followed by purging of the reactor to remove substantially all remaining oxygen source molecules and hydrolysis products formed by condensation reactions. The two steps lead to formation of an atomic layer (or monolayer) because of the self-limiting nature of the surface reaction. These atomic layer reaction steps are repeated multiple times to form the final ALD coating. The term metal oxide precursor especially indicates a precursor of the metal oxide. The precursor itself may not be a metal oxide, but may e.g. include metal organic molecule. Hence, especially the metal (oxide) precursors for ALD may typically include metal halides, alkoxides, amides, and other metal (organic) compounds.

The step by step nature of the ALD process allows conformal coatings also on and in structures with large aspect-ratio such as phosphor particles. The ALD process further allows it to deposit layers of different composition by consecutively feeding different metal oxide precursor into the reactor to form multicomponent layers or nanolaminates with tailored optical properties.

Hence, in a specific embodiment an ALD layer is applied on a GaN surface with phosphor particles to mechanically and optically bond the particles to the substrate. The process is set such that a layer connects particles with the substrate and particle with their neighboring particle. Thus, a phosphor particle network with modified optical properties is formed on the GaN surface enhancing the light output of the LED. The ALD layer may typically have a layer thickness in the 20-500 nm, especially 50-200 nm range.

In a further embodiment the ALD process is set such that not only conformal deposition occurs but also CVD-like growth leading to thicker layers in the voids in between the phosphor particles. CDV-like growth can be realized by shorten the purge time between pulses or reducing the reactor temperature.

A (non-limiting) number of suitable materials for the ALD second coating layer are listed in the following table 1:

TABLE 1

| Oxide material | Metal (oxide_precursor | Oxygen source | Deposition T [° C.] |
|---|---|---|---|
| $Al_2O_3$ | $Al(CH_3)_3$ (TMA) or $HAl(CH_3)_2$ | $H_2O$ or $O_3$ | 100-400 |
| $HfO_2$ | $Hf(N(CH_3)_2)_4$ or $Hf(N(CH_2CH_3)_2)_4$ | $H_2O$ | 80-300 |
| $Ta_2O_5$ | $TaCl_5$ or $Ta(N(CH_3)_2)_5$ | $H_2O$ | 80-300 |

TABLE 1-continued

| Oxide material | Metal (oxide_precursor | Oxygen source | Deposition T [° C.] |
|---|---|---|---|
| $ZrO_2$ | $ZrCl_4$ or $Zr(N(CH_3)_2)_4$ | $H_2O$ | 80-300 |
| $TiO_2$ | $TiCl_4$, $Ti(OCH_3)_4$ or $Ti(OEt)_4$ | $H_2O$ | 80-300 |
| $SiO_2$ | $SiCl_4$, $H_2N(CH_2)_3Si(OEt)_3$ or $Si(OEt)_4$ | $H_2O$ or $O_3$ | 150-300 |

Alternatively or additionally, niobium oxide (especially $Nb_2O_5$) or yttrium oxide ($Y_2O_3$) may be applied. Metal precursors thereof are e.g., tert-butylimido)-tris (diethylamino)-niobium, $NbF_5$, or $NbCl_5$, and Tris(ethylcyclopentadienyl) Yttrium, respectively.

However, other materials may also be applied. Hence, in the atomic layer deposition process a metal oxide precursor may especially be selected from the group of metal oxide precursors of metals selected from the group consisting of Al, Hf, Ta, Zr, Ti and Si. Alternatively or additionally, one or more of Ga, Ge, V and Nb may be applied. Even more especially, alternating layers of two or more of these precursors are applied, wherein at least one precursor is selected from the group consisting of an Al metal oxide precursor and an Si metal oxide precursor, especially an Al metal oxide metal oxide precursor, and another precursor is selected from the group consisting of a Hf metal oxide precursor, a Ta metal oxide precursor, a Zr metal oxide precursor and a Ti metal oxide precursor, especially selected from the group consisting of a Hf metal oxide precursor, a Ta metal oxide precursor, and a Zr metal oxide precursor, even more especially a Ta metal oxide precursor. Especially Hf, Zr, and Ta appear to provide relatively light transmissive layers, whereas Ti, for instance, may provide relatively less light transmissive layers. Processing with Ta, Hf and Zr seems to be relatively easier than Si, for instance. The terms "oxide precursor" or "metal oxide precursor" or "metal (oxide) precursor" may also refer to a combination of two or more chemically different precursors. These precursors especially form an oxide upon reaction with the oxygen source (and are therefore indicated as metal oxide precursor).

EXAMPLE

To form a phosphor converter layer on an LED in accordance with the embodiments disclosed herein, a NYAG4454 (Intematix corp.) phosphor particle material with D50=3.8 μm was used. The phosphor particles were sedimented in ethanol with a screen weight of 2.5 mg/cm² on a blue thin film flip-chip (TFFC) LED. Once the phosphor particles had been applied to the LED, an $Al_2O_3$ coating was then applied in a Picosun Oy ALD reactor. Precursor materials were trimethylaluminum and $H_2O$ for 0, to make the $Al_2O_3$ film. The deposition temperature was set to 150° C. The pulse time in which precursor was introduced was 100 ms, followed by a purge with nitrogen gas of 30 seconds, followed by a pulse of gas-phase water for 100 ms, followed by another purge of nitrogen gas for 30 seconds. Time was allowed after the pulse for the all of the precursor to react with the particles, and LED.

Figure 8:
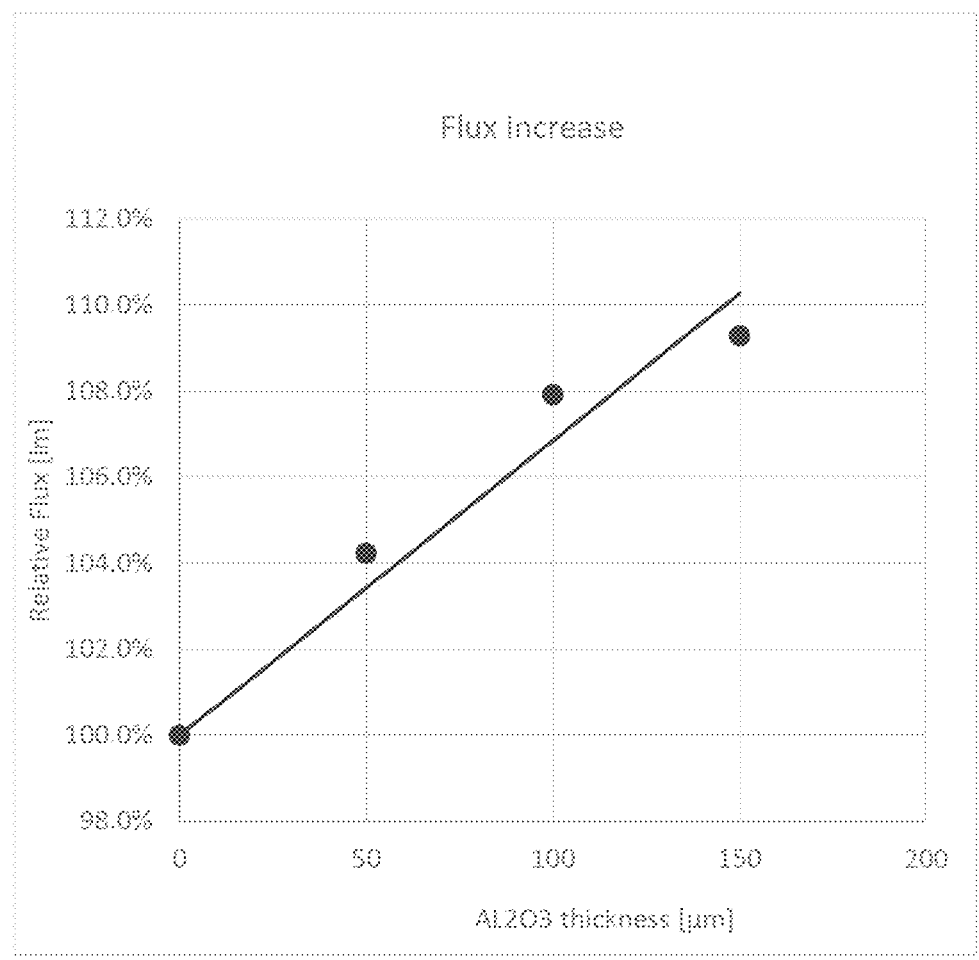
FIG. 8 show the relative flux as a function of $Al_2O_3$ layer thickness in a phosphor converter.

The ALD cycle was repeated to form $Al_2O_3$ inorganic coating layers in 20 nm steps. At each 20 nm step, the emitted flux from the LED at IA was measured in an integrating sphere. FIG. 8 shows the relative flux measured at IA 85° C. socket temperature as a function of $Al_2O_3$ layer thickness. With increasing $Al_2O_3$ layer thickness the flux of the LED at constant current and temperature increases by about 6 percent.

Figure 9:
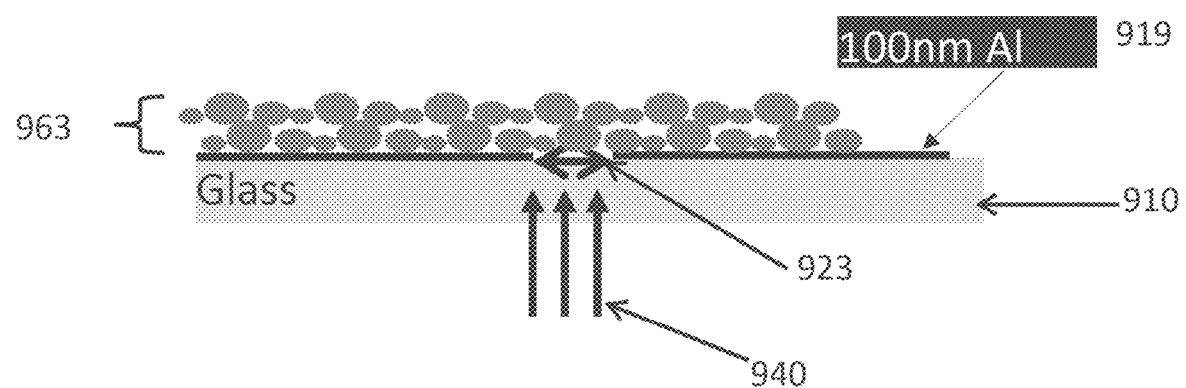
FIG. 9 is a diagram of the experimental setup for the optical contrast measurement of the example phosphor converter.

The optical contrast of the example phosphor converter was also measured. FIG. 9 shows the experimental setup for the optical contrast measurement of the example phosphor converter. The example phosphor converter 963 was formed as described above using YAG:Ce phosphor material particles having D50 of 3.8 μm. The phosphor converter layer was 10 μm thick. The $Al_2O_3$ layer deposited on the phosphor particles by ALD was 50 nm thick. The glass substrate 910 was coated a 100 nm layer of aluminum 919. The aluminum layer 919 has a slit 923 (or line in a plan view, FIG. 10) that was 50 μm wide. To make the measurement, blue light 940 is illuminated on the back side of substrate 910, some of which passed through the slit 923.

Figure 10:
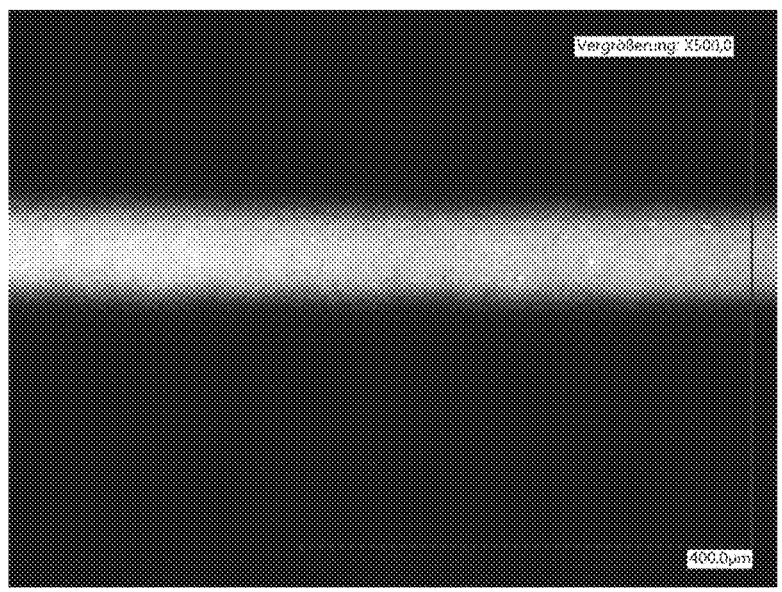
FIG. 10 is an image of the line of blue light through the example phosphor converter layer.

FIG. 10 is an image of the line of blue light through the phosphor converter layer 963. The light distribution was measured with an optical microscope (Keyence VHX-5000), plotting line scans perpendicularly to the open line in the aluminum layer 919.

Figure 11:
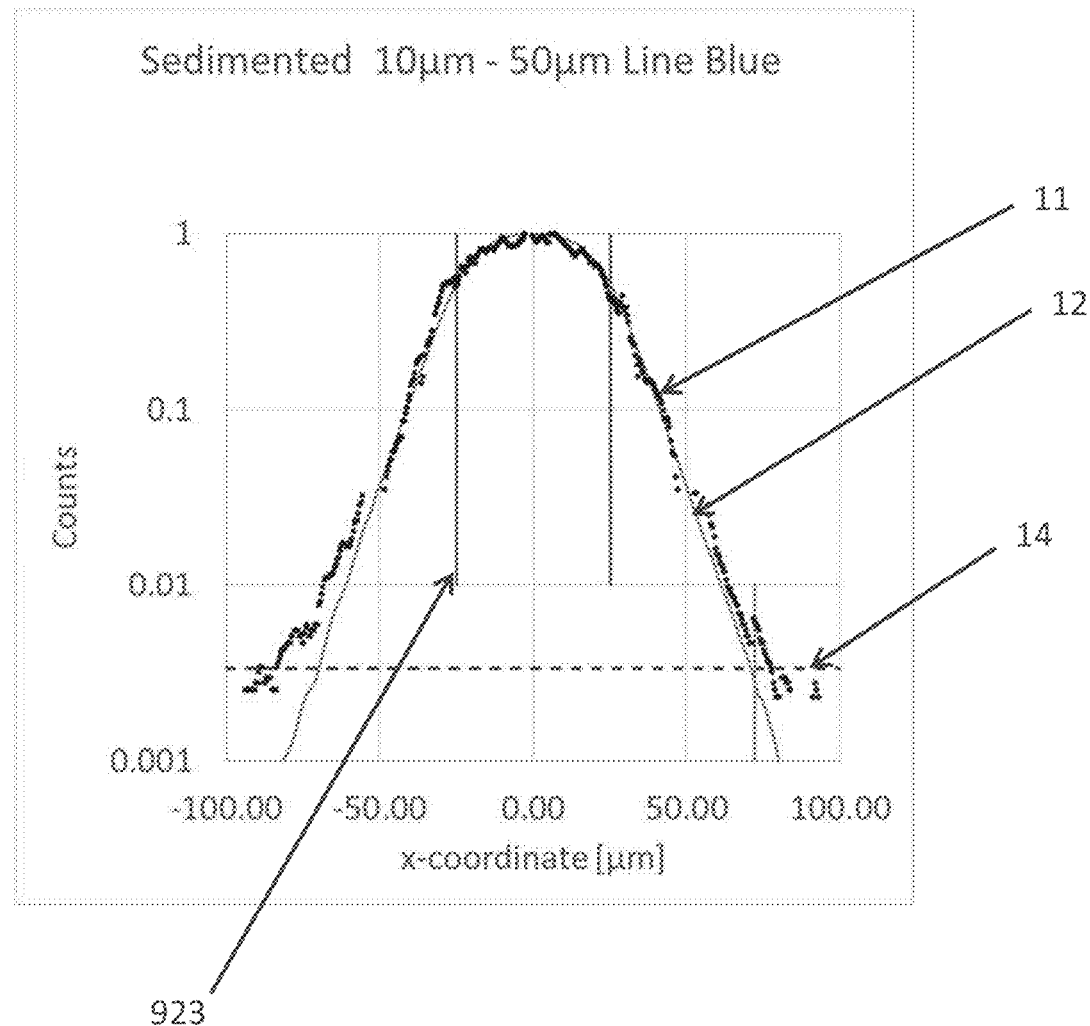
FIG. 11 shows the measured line profile, perpendicular to the open line in the Al layer on the example phosphor converter layer.

FIG. 11 shows the measured line profile 11, perpendicular to the open line in the Al layer 919 on the phosphor converter layer 963. The intensity profile is from the microscopic images. In order to extend the dynamic range of the microscope camera, pictures with different exposure times have been superimposed, always selecting the signal within the dynamic range of the camera (HDR measurement). The measured line profile 11 matches the calculated profile 12. A contrast of 1:300 (14) is reached 47 μm from the edge of the Al layer.

Figure 12:
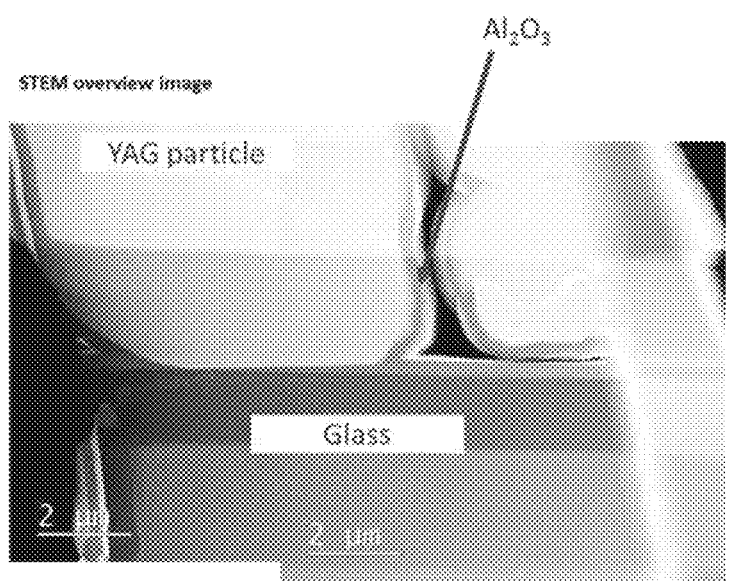
FIG. 12 shows an SEM (scanning electron microscope) image of the interface of a cross-section of a phosphor converter layer on a substrate with the thin layer of $Al_2O_3$ coating the phosphor material particles.

FIG. 12 shows an SEM (scanning electron microscope) image of the interface of a cross-section of a phosphor converter layer on a substrate with the thin layer of $Al_2O_3$ coating the phosphor material particles. This example phosphor converter layer was formed as described above, with YAG phosphor, and the phosphor converter layer was formed on a glass substrate for ease of imaging. The figure shows how the $Al_2O_3$ coats the particles and exposed surface of the glass substrate, and also shows how the particles are in contact with the glass substrate, which glass substrate would be a surface of an LED emitting light. The coating materials may also be assessed by EDAX (an X-ray spectroscopic method for determining elemental composition) analysis.

The following enumerated clauses provide additional non-limiting aspects of the disclosure.

Clause 1. A device comprising: a micro-LED comprising at least two individually addressable light emitting diodes on a same substrate; and a phosphor converter layer disposed on the micro-LED, the phosphor converter layer comprising a plurality of phosphor particles having a D50 of greater than 1 μm and less than 10 μm, wherein a thickness of the phosphor converter layer is greater than 4 μm and less than 20 μm, wherein the phosphor converter layer further comprises a thin layer of non-luminescent material coating on the phosphor particles, and wherein the thin layer has a thickness of less than 200 nm.

Clause 2. The device of clause 1, wherein the plurality of phosphor particles has a D50 of greater than 2 μm and less than 7 μm.

Clause 3. The device of clause 2, wherein the plurality of phosphor particles has a D50 of greater than 3 μm and less than 5 μm.

Clause 4. The device according to any one of the preceding clauses, wherein the particle size D50 is less than 9 μm and the thickness of the thin layer is less than 15 μm.

Clause 5. The device of clause 4, wherein a thickness of the phosphor converter layer is greater than 8 μm and less than 15 μm.

Clause 6. The device of clause 5, wherein a thickness of the phosphor converter layer is greater than 10 μm and less than 13 μm.

Clause 7. The device of any of clauses 1-6, wherein the phosphor converter layer further comprises a matrix, and the matrix has a refractive index of 1 or greater and less than or equal to 1.5.

Clause 8. The device of clause 7, wherein the matrix has a refractive index of 1 or greater and less than 1.4.

Clause 9. The device of clause 8, wherein the matrix has a refractive index of 1 or greater and less than 1.2.

Clause 10. The device of any of clauses 1-9, wherein the phosphor converter layer is obtainable by spray coating or sedimentation.

Clause 11. The device of clause 10, wherein the thin layer comprises a metal oxide.

Clause 12. The device of clause 11, wherein the thin layer comprises at least one of $Al_2O_3$, $HfO_2$, $Ta_2O_5$, $ZrO_2$, $TiO_2$, and $SiO_3$.

Clause 13. The device of clause 10, wherein the thin layer is formed by atomic layer deposition.

Clause 14. The device of clause 10, wherein the thin layer has a thickness between 40-150 nm.

Clause 15. A device comprising: a light emitting diode; and a phosphor converter layer on the light emitting diode, the phosphor converter layer including a plurality of phosphor particles and a thin layer of a non-luminescent material formed over the phosphor particles, wherein a thickness of the phosphor converter layer is greater than 4 μm and less than 20 μm, wherein the phosphor converter layer further comprises a thin layer of non-luminescent material coating on the phosphor particles, and wherein the thin layer has a thickness of less than 200 nm.

This disclosure is illustrative and not limiting. Further modifications will be apparent to one skilled in the art in light of this disclosure and are intended to fall within the scope of the appended claims.

The invention claimed is:

1. A device comprising:
    a micro-LED comprising at least two individually addressable light emitting diodes on a same substrate; and
    a phosphor converter layer disposed on the micro-LED and extending over the at least two light emitting diodes and across a gap therebetween, the phosphor converter layer comprising a plurality of phosphor particles having an average particle size or median diameter (D50) of greater than 1 μm and less than 10 μm, wherein a thickness of the phosphor converter layer is greater than 4 μm and less than 20 μm, wherein the phosphor converter layer further comprises a thin layer of non-luminescent material coating on the phosphor particles, and wherein the thin layer has a thickness of less than 200 nm,
    the at least two light emitting diodes exhibiting a contrast ratio greater than 1:18, said contrast ratio resulting at least in part from the D50 of the phosphor particles and the thickness of the phosphor converter layer.

2. The device of claim 1, wherein the plurality of phosphor particles has a D50 of greater than 2 μm and less than 7 μm.

3. The device of claim 2, wherein the plurality of phosphor particles has a D50 of greater than 3 μm and less than 5 μm.

4. The device of claim 1, wherein the thickness of the phosphor converter layer is greater than 8 μm and less than 15 μm.

5. The device of claim 1, wherein the thickness of the phosphor converter layer is greater than 10 μm and less than 13 μm.

6. The device of claim 1, wherein the phosphor converter layer further comprises a matrix, and the matrix has a refractive index of 1 or greater and less than or equal to 1.5.

7. The device of claim 6, wherein the matrix has a refractive index of 1 or greater and less than 1.4.

8. The device of claim 7, wherein the matrix has a refractive index of 1 or greater and less than 1.2.

9. The device of claim 1, wherein the thin layer comprises a metal oxide.

10. The device of claim 9, wherein the thin layer comprises at least one of $Al_2O_3$, $HfO_2$, $Ta_2O_5$, $ZrO_2$, $TiO_2$, and $SiO_2$.

11. The device of claim 1, wherein the thin layer has a thickness between 40-150 nm.

12. The device of claim 1, the contrast ratio being greater than 1:100.

13. A method for making the device of claim 1, the method comprising:
    depositing the plurality of phosphor particles in a layer that extends over the at least two light emitting diodes on the substrate and across the gap between the at least two light emitting diodes; and
    forming the thin layer of non-luminescent material so as to coat the phosphor particles.

14. The method of claim 13, wherein the phosphor converter layer is deposited by spray coating or sedimentation.

15. The method of claim 13, wherein the thin layer is formed by atomic layer deposition.

16. The method of claim 13, wherein the thin layer comprises a metal oxide.

17. The method of claim 16, wherein the thin layer comprises at least one of $Al_2O_3$, $HfO_2$, $Ta_2O_5$, $ZrO_2$, $TiO_2$, and $SiO_2$.

18. The method of claim 13, wherein the plurality of phosphor particles has a D50 of greater than 2 μm and less than 7 μm.

19. The method of claim 13, wherein the thickness of the phosphor converter layer is greater than 8 μm and less than 15 μm.

20. The method of claim 13, wherein the phosphor converter layer further comprises a matrix, and the matrix has a refractive index of 1 or greater and less than or equal to 1.5.

* * * * *